(12) United States Patent
Ikeda

(10) Patent No.: US 8,552,650 B2
(45) Date of Patent: Oct. 8, 2013

(54) PLASMA FORMATION REGION CONTROL APPARATUS AND PLASMA PROCESSING APPARATUS

(75) Inventor: Yuji Ikeda, Kobe (JP)

(73) Assignee: Imagineering, Inc., Kobe-shi, Hyogo (JP)

( * ) Notice: Subject to any disclaimer, the term of this patent is extended or adjusted under 35 U.S.C. 154(b) by 936 days.

(21) Appl. No.: 12/668,787

(22) PCT Filed: Jul. 12, 2008

(86) PCT No.: PCT/JP2008/062635
§ 371 (c)(1),
(2), (4) Date: Jan. 12, 2010

(87) PCT Pub. No.: WO2009/008517
PCT Pub. Date: Jan. 15, 2009

(65) Prior Publication Data
US 2010/0186670 A1   Jul. 29, 2010

(30) Foreign Application Priority Data

Jul. 12, 2007   (JP) ................................. 2007-183751

(51) Int. Cl.
*H01J 7/24* (2006.01)
*C23C 16/00* (2006.01)

(52) U.S. Cl.
USPC ............................... 315/111.21; 118/723 AN

(58) Field of Classification Search
USPC ........ 315/111.01, 111.21, 500, 507; 118/723; 156/345
See application file for complete search history.

(56) References Cited

U.S. PATENT DOCUMENTS

| | | | |
|---|---|---|---|
| 3,934,566 A | 1/1976 | Ward | |
| 4,138,980 A | 2/1979 | Ward | |
| 5,696,428 A * | 12/1997 | Pasch | 315/111.21 |
| 6,057,645 A | 5/2000 | Srivastava et al. | |
| 6,340,863 B1 | 1/2002 | Ikeda et al. | |
| 6,650,059 B2 | 11/2003 | Ikeda et al. | |
| 2002/0023896 A1* | 2/2002 | Tachino et al. | 216/67 |
| 2002/0063530 A1 | 5/2002 | Ikeda et al. | |
| 2002/0070670 A1 | 6/2002 | Ikeda et al. | |
| 2002/0074946 A1 | 6/2002 | Ikeda et al. | |
| 2002/0101162 A1 | 8/2002 | Ikeda et al. | |

FOREIGN PATENT DOCUMENTS

| | | |
|---|---|---|
| JP | 51-77719 A | 7/1976 |
| JP | 2000-133494 A | 5/2000 |
| JP | 2001-527300 A | 12/2001 |
| JP | 2003-178900 A | 6/2003 |

(Continued)

OTHER PUBLICATIONS

International Search Report of PCT/JP2008/062635, mailing date of Sep. 16, 2008.

*Primary Examiner* — Jimmy Vu
(74) *Attorney, Agent, or Firm* — Westerman, Hattori, Daniels & Adrian, LLP

(57) ABSTRACT

There is provided a plasma formation region control apparatus, with which a large-scale plasma can be obtained under a high pressure with ease and at low cost. The plasma formation region control apparatus comprises a microwave oscillator, an antenna connected to the microwave oscillator, and controller for controlling the position of each of the microwave oscillator and the antenna. The controller positions the antenna towards a plasma formation region in accordance with a specification for a plasma region for respective points in time t; establishes a driving sequence for the microwave oscillator based on the temperature state of the specified plasma; and drives the microwave oscillator according to the driving sequence.

20 Claims, 8 Drawing Sheets

(56) References Cited

FOREIGN PATENT DOCUMENTS

| JP | 2004-216231 A | 8/2004 |
| JP | 2004-363089 A | 12/2004 |
| JP | 2006-004684 A | 1/2006 |
| JP | 2006-274322 A | 10/2006 |
| JP | 2006-278643 A | 10/2006 |
| JP | 2006-302652 A | 11/2006 |
| JP | 2007-026981 A | 2/2007 |
| JP | 2007-113570 A | 5/2007 |
| WO | 99/33673 A1 | 7/1999 |

* cited by examiner

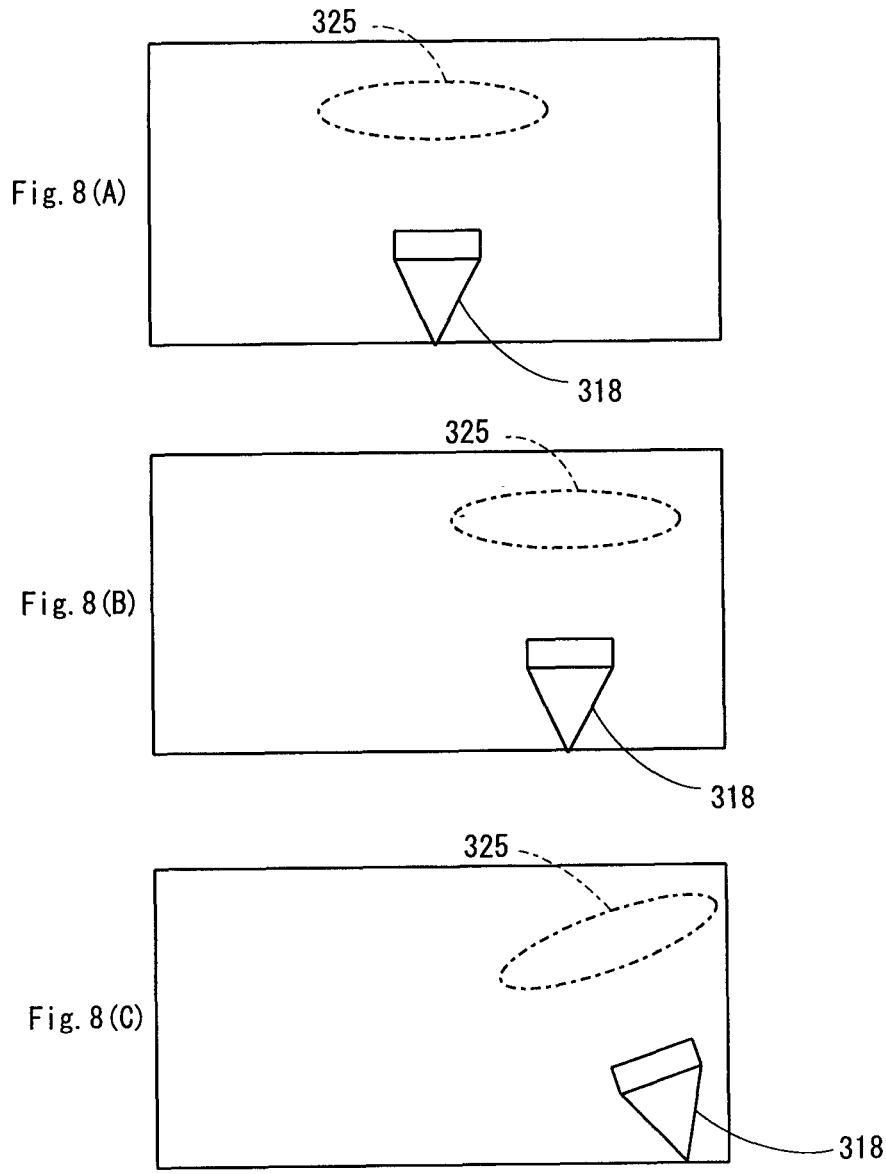

PLASMA FORMATION REGION CONTROL APPARATUS AND PLASMA PROCESSING APPARATUS

TECHNICAL FIELD

The description relates to a plasma formation region control apparatus for controlling a region in which a plasma is formed, and specifically to an apparatus for expanding and moving a region in which a plasma is induced in a gas under a high pressure equal to or exceeding atmospheric pressure, and to a plasma processing apparatus that uses the control apparatus.

BACKGROUND OF THE INVENTION

Directly generating plasma using a gas under atmospheric pressure or a higher pressure eliminates the need for a high-vacuum device or similar equipment, and makes it possible to utilize plasma readily and inexpensively. It also becomes possible to utilize plasma in a wider range of industrial fields.

Although small-scale plasma can be generated using discharging or another method in which a spark plug or similar device is used, the plasma deactivates quickly under high pressures, making it difficult to generate a plasma on a large scale.

With the foregoing circumstances in view, attempts have been made to generate plasma under high pressures that equal or exceed atmospheric pressure. For example, a technique for generating and maintaining a plasma under a high pressure using a plasma torch is described in patent reference 1. According to this technique, a source gas is heated to an extremely high temperature using high-frequency waves, and a thermal plasma is generated.

A technique for generating a plasma in a supercritical fluid environment using an electrical discharge or a laser is described in patent reference 2.

Described in patent reference 3 is an apparatus that pressurizes sulfur hexafluoride ($SF_6$) and helium to about 100 atmospheres and generates a plasma using a dielectric-barrier discharge, with the pressurized gas used as a source gas.

Patent reference 1: Japanese Laid-open Patent Publication No. 2004-216231

Patent reference 2: Japanese Laid-open Patent Publication No. 2003-178900

Patent reference 3: Japanese Laid-open Patent Publication No. 2006-004684

SUMMARY OF THE INVENTION

The size of a plasma generated using an electrical discharge is dependent on the distance between electrodes. Also, a high voltage must be applied between electrodes in order to increase the size of a plasma using an electrical discharge. Energy efficiency drops with increasing distance between electrodes; therefore, the amount of energy required increases significantly.

When a plasma torch is used to generate and maintain a plasma under a high pressure, the high temperature of the plasma makes it difficult to handle and limits its scope of use. Furthermore, a high-density source gas must be heated to a high temperature, and a large amount of energy is required. In contrast to when a plasma is formed under a reduced pressure, forming a plasma under a high pressure not only involves the plasma having a high temperature, but also the gas within the plasma-forming region having a high density and a high heat capacity. Therefore, a measure to counter heat is necessary in order to use a plasma torch under a high pressure. Increasing the scale of the plasma torch would require the heat-countering measure to be on a larger scale.

Also, using a supercritical fluid as a plasma starting material requires that the starting material first be made to enter a supercritical state, which reduces versatility. In order to increase the size of the plasma, it is necessary to first form a medium in a supercritical state on a large scale, and such a process would require vast equipment costs. Therefore, the method is not practical.

Also, sulfur hexafluoride used in the apparatus described in patent reference 3 is an acutely toxic substance, and additionally exhibits a strong greenhouse effect. Therefore, such an apparatus requires vast equipment costs to prevent the gas from leaking and to render it harmless.

A plasma formation region control apparatus and an ignition apparatus are provided, with which a large-scale plasma can be obtained under a high pressure with ease and at low cost.

According to a first aspect, a plasma formation region control apparatus for controlling a region of plasma formation under a pressure equal to or exceeding atmospheric pressure, the plasma formation region control apparatus comprises one or a plurality of electromagnetic wave oscillators; one or a plurality of antennas connected to the electromagnetic wave oscillator; and a controller controlling the electromagnetic wave oscillator and the antenna; wherein the controller positions the antenna in accordance with a spatial distribution of an electrical field that corresponds to a plasma formation region, the spatial distribution being based on a specification for the plasma region for respective points in time; establishes a sequence for driving the electromagnetic wave oscillator based on the state of radicals, ions, or a gas, or the electron density, within the specified plasma; and drives the electromagnetic wave oscillator according to the sequence.

According to a second aspect, a plasma formation region control apparatus for controlling a region of plasma formation under a pressure equal to or exceeding atmospheric pressure, the plasma formation region control apparatus comprises one or a plurality of electromagnetic wave oscillators; one or a plurality of antennas connected to the electromagnetic wave oscillator; and a controller controlling the electromagnetic wave oscillator and the antenna; wherein the controller positions the antenna in accordance with a spatial distribution of an electrical field that corresponds to a plasma formation region, the spatial distribution being based on a specification for the plasma region for respective points in time; establishes a sequence for driving the electromagnetic wave oscillator based on a state function of the specified plasma, the intensity of plasma emission, or the intensity of an emission element within a predetermined wavelength range, or of the electron temperature, travel velocity, or path; and drives the electromagnetic wave oscillator according to the sequence.

According to a third aspect, the plasma formation region control apparatus of the first or second aspect is preferably configured such that the controller establishes the sequence so that electromagnetic waves are emitted by the electromagnetic wave oscillator and the antenna for a time period that is shorter than the thermal relaxation time of electrons and radicals, ions, or gas generated in the plasma formation region.

According to a fourth aspect, the plasma formation region control apparatus of the first or second aspect is preferably configured such that the controller establishes the sequence so that electromagnetic waves are emitted by the electromagnetic wave oscillator and the antenna for a time period until radicals, ions, or gas generated in the plasma formation region reach a predetermined temperature.

According to a fifth aspect, the plasma formation region control apparatus of the first or second aspect is preferably configured such that the controller establishes the sequence so that emission of electromagnetic waves ceases when a time period that is shorter than thermal relaxation time of electrons and radicals, ions, or gas generated in the plasma formation region elapses from the scheduled time of plasma generation.

According to a sixth aspect, the plasma formation region control apparatus of the first through fifth aspects is preferably configured such that the controller repeatedly drives the electromagnetic wave oscillator in accordance with the sequence.

According to a seventh aspect, the plasma formation region control apparatus of the first through sixth aspects is preferably configured such that the controller establishes the plasma formation region so as to enclose a point within a region in which the plasma is due to be generated, and drives the electromagnetic wave oscillator from a point in time that precedes the scheduled time of plasma generation by a predetermined time period.

According to an eighth aspect, the plasma formation region control apparatus of the first or second aspect is preferably configured such that the controller continuously drives the electromagnetic wave oscillator in accordance with the sequence.

According to a ninth aspect, the plasma formation region control apparatus of the first through eighth aspects is preferably configured such that a location at which an electrical field created by electromagnetic waves radiating from the antenna is at maximum intensity at a predetermined point in time is positioned outside a region in which plasma is present at the point in time, and the maximum intensity is less than an electrical field strength at which a substance within the plasma formation region at the point in time undergoes electrical breakdown.

According to a tenth aspect, the plasma formation region control apparatus of the first through ninth aspects is preferably configured such that the controller has an antenna holder in a moveable and/or rotatable manner, wherein the antenna holder points the antenna towards the plasma formation region at respective points in time.

According to an eleventh aspect, the plasma formation region control apparatus of the first through tenth aspects is preferably configured such that the controller further has an antenna configure portion configuring the antenna shape in accordance with the spatial distribution of the corresponding electrical field.

A plasma processing apparatus comprises one of the following aspects.

According to a twelfth aspect, the plasma formation region control apparatus of the first aspect is preferably configured such that a plurality of the plasma formation region exists in time or space, and the antenna is positioned and the sequence established so that the electrical field distribution is formed in a region between each of the plasma formation regions.

According to a thirteenth aspect, the plasma formation region control apparatus of the first aspect is preferably configured such that the antenna is positioned and a sequence established so as to cause a plurality of locations with an extremely high electrical field strength to form within the plasma formation region at a predetermined point in time.

According to a fourteenth aspect, the plasma formation region control apparatus of the thirteenth aspect is preferably configured such that a distance between each of the locations with an extremely high electrical field strength increases after the predetermined point in time.

According to a fifteenth aspect, a plasma processing apparatus comprises the plasma formation region control apparatus to the first through fourteenth aspects, wherein the plasma formation region control apparatus controlling a plasma used to process a substance that is present within the plasma formation region.

According to a sixteenth aspect, the plasma processing apparatus of the fifteenth aspect is preferably configured to further comprise: an extracting portion extracting light originating from the plasma formation region.

According to a seventeenth aspect, the plasma processing apparatus of the fifteenth aspect is preferably configured to further comprise: a measurement taking measurements of a plasma that forms in the plasma formation region, wherein supply of the substance is regulated according to a result of a measurement taken by the measuring means.

According to an eighteenth aspect, the plasma processing apparatus of the fifteenth aspect is preferably configured to further comprise: a measurement taking measurements of a plasma that forms in the plasma formation region, wherein the controller performs at least one of positioning the antenna and establishing the sequence in accordance with a result of measurement taken by the measuring means.

The first through ninth aspects enable the plasma formation region control apparatus to form a desired spatial electrical field distribution and control the position and size of a plasma. Also, by controlling the duration of a pulse on a microwave oscillator side, it is possible to obtain a plasma fulfilling desired temperature conditions (i.e., a thermal non-equilibrium state or a desired temperature).

In other words, a plasma formation region control apparatus and a plasma processing apparatus are provided, with which a large-scale plasma can be obtained under a high pressure with ease and at low cost.

BRIEF DESCRIPTION OF THE DRAWINGS

FIG. 8 is a drawing describing an operation of a plasma formation region control apparatus according to a second embodiment of the present invention.

DETAILED DESCRIPTION OF THE INVENTION

First Embodiment

Best modes for carrying out the invention will now be described with reference to drawings.

Figure 1:
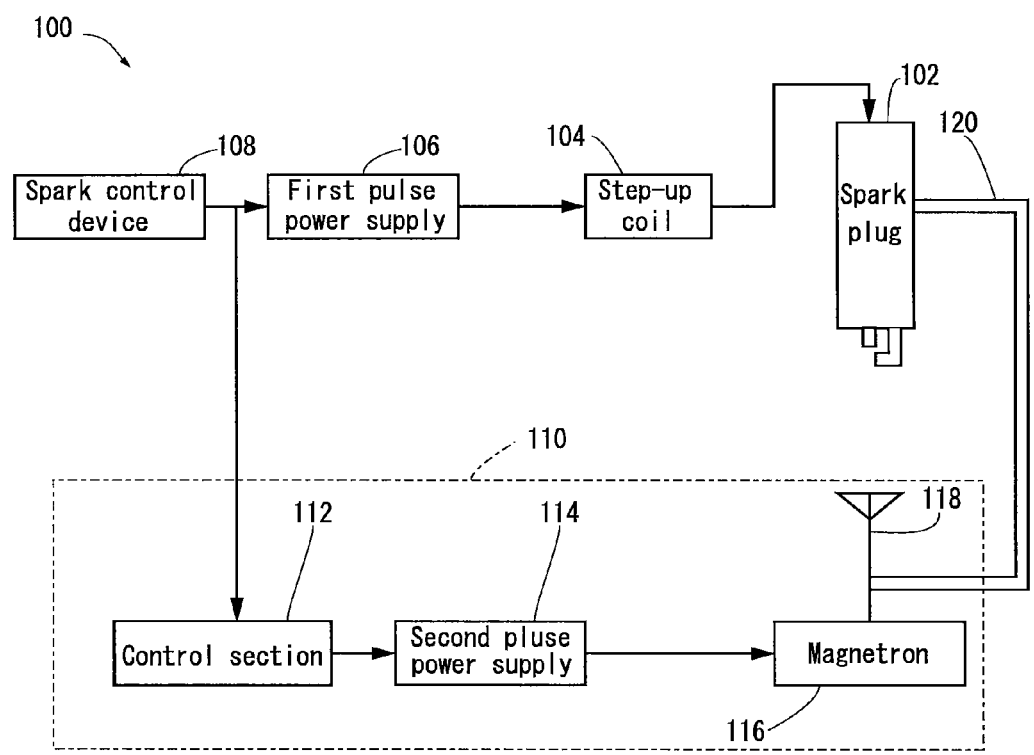
FIG. 1 is a block diagram showing a configuration of a first embodiment of a plasma formation region control apparatus according to the present invention.

FIG. 1 is a block diagram showing an overall configuration of a plasma formation region control apparatus that has a plasma expansion device 100 used alongside a spark plug.

As shown in FIG. 1, the plasma expansion device 100 has a spark plug 102, a step-up coil 104 connected to the spark plug 102, a first pulse power supply 106 connected to the step-up coil 104, a spark control device 108 connected to the first pulse power supply, and a plasma expansion device 110 connected to the spark control device 108.

The plasma expansion device 110 has a control section 112 that constitutes controller and is connected to the first pulse power supply 106, a second pulse power supply 114 connected to the control section 112, a magnetron 116 connected to the second pulse power supply 114, and an antenna 118 connected to the magnetron 116. The system also has a support member 120 joined to the spark plug 102 and the antenna 118. The support member 120 supports the antenna 118 and the spark plug 102 so that the antenna 118 points towards a discharge gap of the spark plug 102.

Of components that constitute the plasma expansion device 100, an electrode portion of the spark plug 102 and the antenna 118 are located in a high-pressure environment with a pressure that equals or exceeds atmospheric pressure. The magnetron 116 is, specifically, one that oscillates at 2.45 GHz for use in a microwave oven.

The spark control device 108 generates a control signal for indicating the timing of a discharge produced by the spark plug. The first pulse power supply 106 generates a DC pulse voltage in response to the control signal generated by the spark control device 108. The step-up coil 104 steps up the pulse voltage applied to a primary side and applies the resulting high-voltage pulse signal to a secondary side. The spark plug 102 is subjected to the high-voltage pulse signal, and an electrical discharge is produced between a center electrode and an earthing electrode, whereby a small-scale plasma is generated. The control section 112 determines a timing for generating a microwave pulse in accordance with the control signal from the spark control device 108, and generates a control signal for indicating the timing. The second pulse power supply 114 supplies power to the magnetron 116 for a short period of time in response to the control signal from the control section 112. The magnetron 116 oscillates at 2.45 GHz while being supplied with the power, and generates a microwave pulse. The antenna 118 receives the microwave pulse input feed, and a radiating end of the antenna 118 towards the spark plug 102 radiates a microwave pulse.

Figure 2:
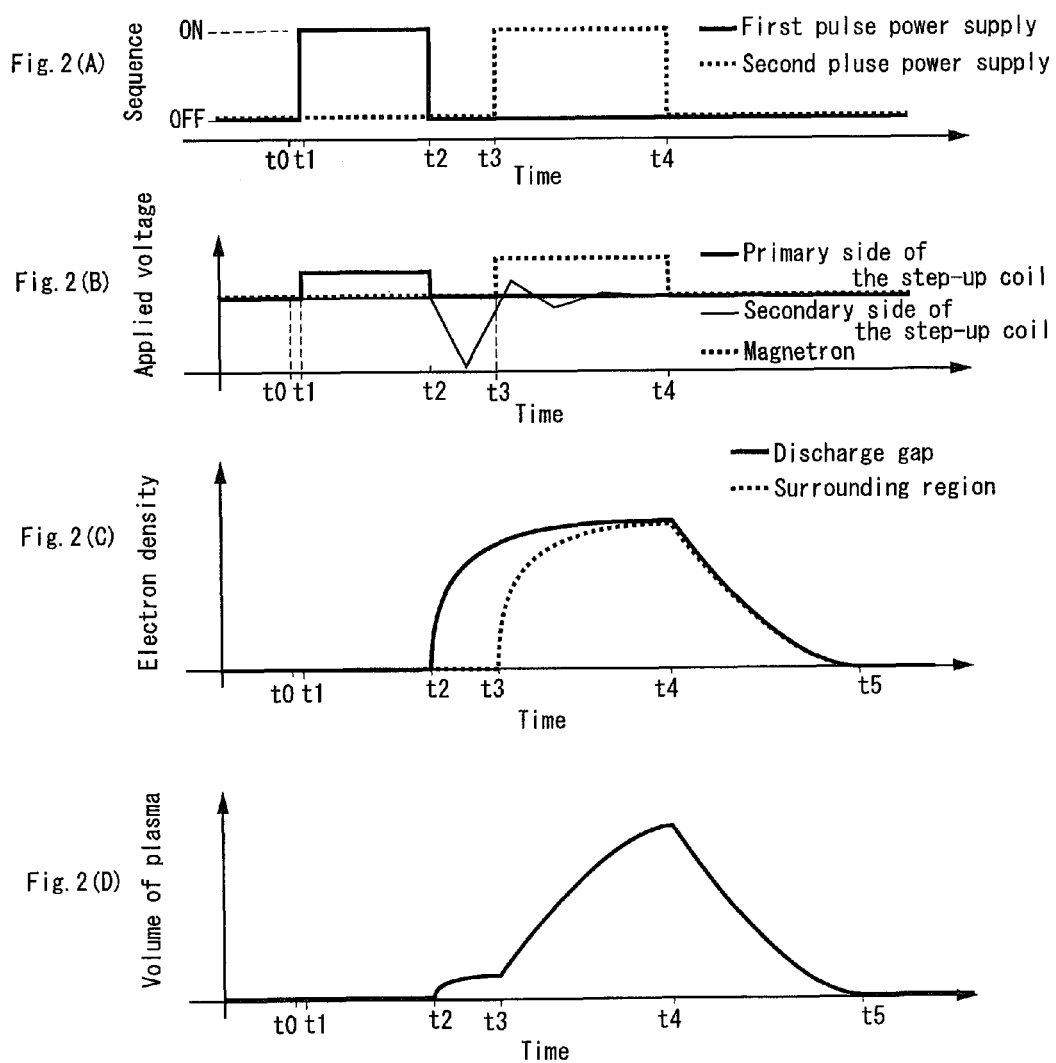
FIG. 2 is a drawing describing an operation of the plasma formation region control apparatus.

FIG. 2 shows an operation of each of the sections of the plasma expansion device 100 in a time series.

A plasma expansion method according to the present embodiment will now be described using FIG. 2. As shown in FIG. 2(a), the spark control device 108 generates a control signal at time t1. In response, the first pulse power supply 106 begins to generate a DC pulse voltage. The DC pulse voltage is thereby applied to the primary side of the step-up coil 104 as shown in FIG. 2(b). The step-up coil 104 accumulates energy from the DC pulse voltage.

At time t2, when a current on the primary side of the step-up coil 104 reaches a predetermined value, a current flows on the secondary side of the step-up coil 104 as shown in FIG. 2(b). A high-voltage pulse voltage begins to be applied to the spark plug 102, and a spark discharge is produced in the discharge gap of the spark plug 102. As a result, a plasma is generated at the discharge gap section, and as shown in FIG. 2(c), the electron density at this section increases. Since the volume of the plasma formation region is dependent on the distance between the electrodes, the plasma, despite having formed at the discharge gap section, does not subsequently expand beyond a specific volume, as shown in FIG. 2(d).

When the control section 112 feeds a control signal to the second pulse power supply 114 at time t3 under such circumstances, the second pulse power supply 114 begins to feed power to the magnetron 116 as shown in FIG. 2(c). Consequently, the magnetron 116 begins to oscillate and generate a microwave pulse. As a result, the antenna radiates a microwave pulse towards the discharge gap.

After time t3, the plasma that forms at the discharge gap section is fed energy from the microwave pulse. Electrons in the discharge gap section are thereby accelerated and escape from the plasma region. Escaped electrons collide with gas in a surrounding region in the vicinity of the plasma. The collisions cause the gas in the surround region to ionize and turn to plasma as shown by a dotted line in FIG. 2(c). Electrons are also present in the region in which plasma is newly induced. The microwave pulse also causes such electrons to accelerate and collide with gas in the surrounding area. The sequence of these events, in which electrons in the plasma accelerate and collide with the gas, causes the gas to ionize and free electrons to form in a cascading manner. This phenomenon spreads in sequence to a surrounding region of the discharge plasma, and plasma is induced in the surrounding region. The volume of the plasma expands through the action described above.

When the second pulse power supply subsequently stops feeding power at a time t4, the microwave pulse radiation stops. Recombination becomes predominant over ionization within the region in which the plasma is present. As a result, the electron density decreases. The volume of the plasma consequently begins to decrease. The plasma disappears at time t5 when the recombination of electrons is complete.

The amount of energy required to obtain a plasma of a desired size using this apparatus can be regarded as the sum of the energy required to generate a plasma in a small pre-expansion region and the energy required to cause electrons to accelerate to an extent that the ionization chain reaction spreads to a region of the desired size. The total energy required is less than the amount of energy required to electrically break down the entire source gas directly using microwaves, or to raise the overall temperature of the source gas and induce plasma. It therefore becomes possible to obtain a large-scale plasma using a small amount of energy under a high-pressure environment which requires a large amount of energy to induce plasma. Specifically, the plasma can be expanded to about one million times the volume of the plasma generated by the discharge produced by the spark plug 102.

Energy required for the expansion of the plasma is radiated from the antenna. The microwave that radiates from the antenna is not limited in range unless it is shielded. Therefore, it is possible to expand the plasma to a desired size without being restricted by factors such as the distance between electrodes.

The duration of the microwave pulse may be determined according to the gas and/or electron temperatures.

Figure 3:
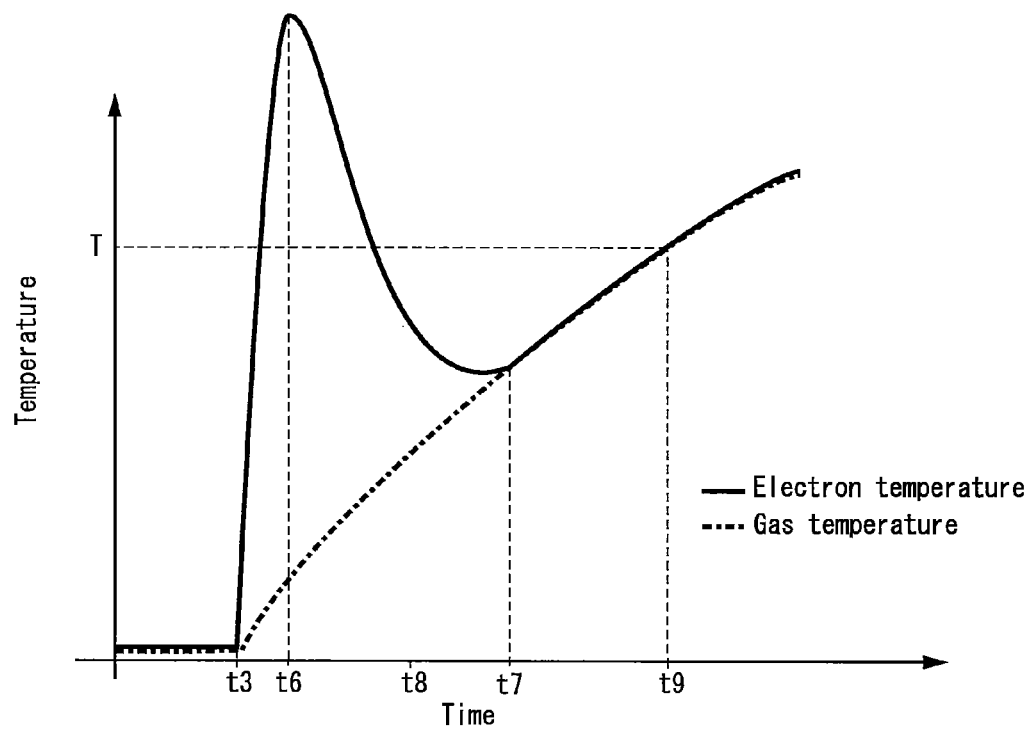
FIG. 3 is a drawing describing a process in which radiation of microwaves is controlled according to plasma temperature.
Figure 4A:
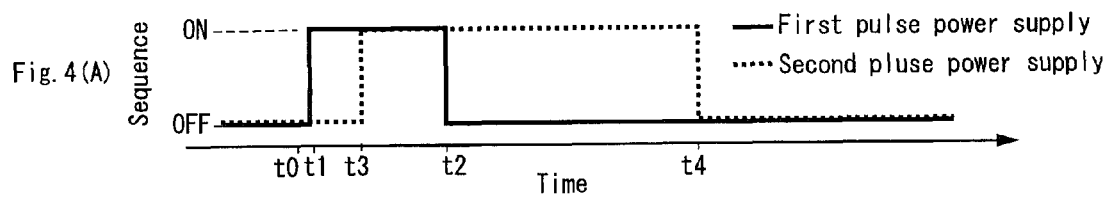
FIG. 4 is a drawing describing an operation of a plasma formation region control apparatus according to a first modification of the first embodiment.
Figure 4B:
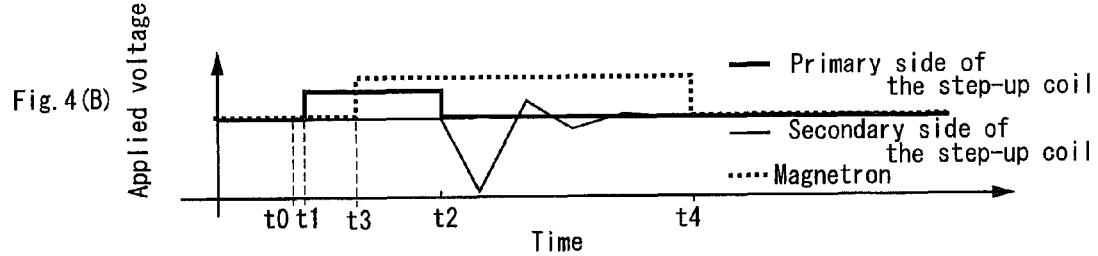
Figure 4C:
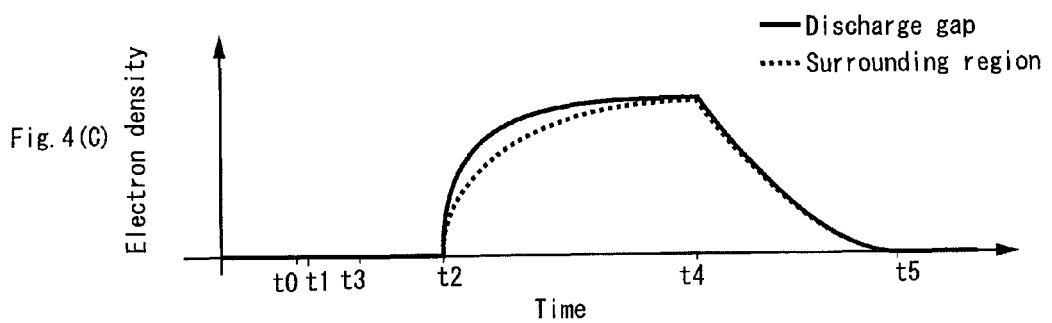
Figure 4D:
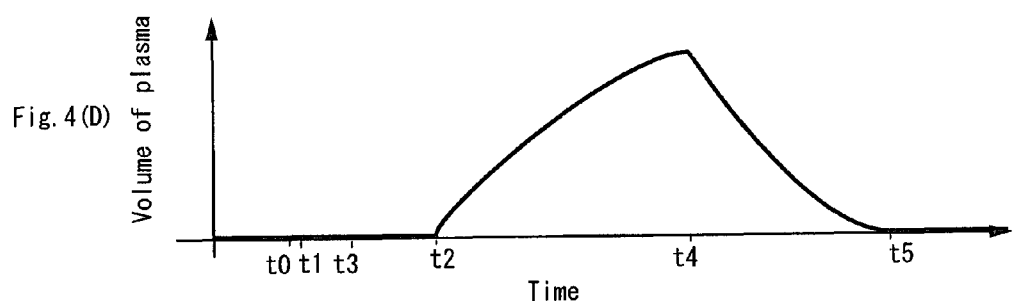

FIG. 3 is a schematic representation of time-series changes in gas and electron temperatures within a region where plasma is formed by expansion when energy is supplied in a sustained manner using microwaves.

As shown in FIG. 3, the plasma present between time t3, when the plasma expansion starts, and time t7, is what is known as a non-equilibrium plasma. In other words, the plasma is in a non-equilibrium state, where the electron temperature is not equal to the radical temperature, ion temperature, or gas temperature. The gas temperature will be used in the description below to represent the radical temperature, ion temperature, or gas temperature. When the plasma is formed, the difference between the electron temperature and the gas temperature increases with time until time t6. The temperature difference begins to decrease at time t6, and thermal relaxation is achieved at time t7. In other words, the difference between the electron temperature and the gas temperature reaches zero. The subsequent plasma is what is known as a thermal plasma (or a thermal equilibrium plasma). The electron temperature and the gas temperature both continue to increase. Specifically, the time between time t3 and time t7 is about several hundred nanoseconds when air of about 2 MPa or less is used as a working gas.

In an instance where the second pulse power supply 114 shown in FIG. 1 stops feeding electricity to the magnetron 116 during a time period of about 1 microsecond after time t2 in accordance with the control signal from the control section 112, the expansion caused by the microwaves stops before thermal relaxation is achieved. Such a configuration makes it possible to selectively obtain an expanded non-equilibrium plasma only.

The microwave pulse oscillation may be concluded when the gas temperature reaches a predetermined temperature T. The predetermined temperature T may be suitably determined according to factors such as the intended use of the plasma expansion device 100 and material used in component parts.

For example, when an air plasma is being expanded, setting time t4 so that it occurs before time t9 at which the predetermined temperature T (e.g. 1500° C.) makes it possible to reduce the amount of nitrogen oxides created by heat.

First Modification of the First Embodiment

FIG. 4 shows a configuration of a plasma expansion device 200 according to a first embodiment.

The plasma expansion device 200 has, instead of the control section 112 of the plasma expansion device 100 shown in FIG. 1, a control section 212; the control section 212 being connected to the spark control device 108, the second pulse power supply 114, and the first pulse power supply 106 as shown in FIG. 4. In other words, in the plasma expansion device 200, the first pulse power supply 106 is connected to the control section 212 instead of the spark control device 108.

The control section 212 has a function for determining the timing at which the spark plug produces a discharge and the timing at which the antenna 118 radiates a microwave pulse, based on a signal received from the spark control device 108.

On receiving the control signal from the spark control device 108, the control section 212 then issues a control signal to each of the first pulse power supply 106 and the second pulse power supply 114 when each of the respective generators are due to operate, using the time at which the control signal from the spark control device 108 is received as a reference.

Each of the first pulse power supply 106, the step-up coil 104, and a spark coil perform an operation similar to that in the first embodiment according to the timing determined by the control section 212. The second pulse power supply 114, the magnetron 116, and the antenna 118 each perform an operation similar to that the first embodiment.

In the plasma expansion device 200, the control section 212 can control the timing of the discharge and the timing of the microwave pulse radiation in an integrated manner. For example, the following operation is possible: the control section 212 can issue a control signal to the second pulse power supply 114 before issuing a control signal to the first pulse power supply 106. The radiation of microwaves thereby commences before the spark plug 102 produces the plasma discharge. As shown in FIG. 4, the time t3 at which the microwave oscillation commences may be set so as to occur before time t2. By setting the time t3, at which oscillation commences, so as to precede time t2 by a time period equal to or longer than the time required to start the magnetron, it is possible to commence expansion of the plasma immediately after the formation of the plasma due to discharge.

It is also possible to preheat a region surrounding the discharge plasma using the microwave pulse, aiding the expansion of the plasma. Also, by performing such an operation, it is possible to feed power to the magnetron 116 for a longer duration before the discharge commences. It is therefore possible to use a magnetron 116 that has a slow start-up time.

Provided that the spark control device 108 is one that issues a control signal repeatedly at a predetermined interval, the plasma expansion device 100 in the first embodiment is capable of exhibiting an advantage similar to that in the first embodiment.

In other words, the timing at which a control signal issued by the spark control device is received and the period between successive control signals are criteria by which the control section 112 determines a time at which the subsequent control signal will be received, and activates the second pulse power supply according to the timing determined for the next control signal.

Second Modification of the First Embodiment

Figure 5:
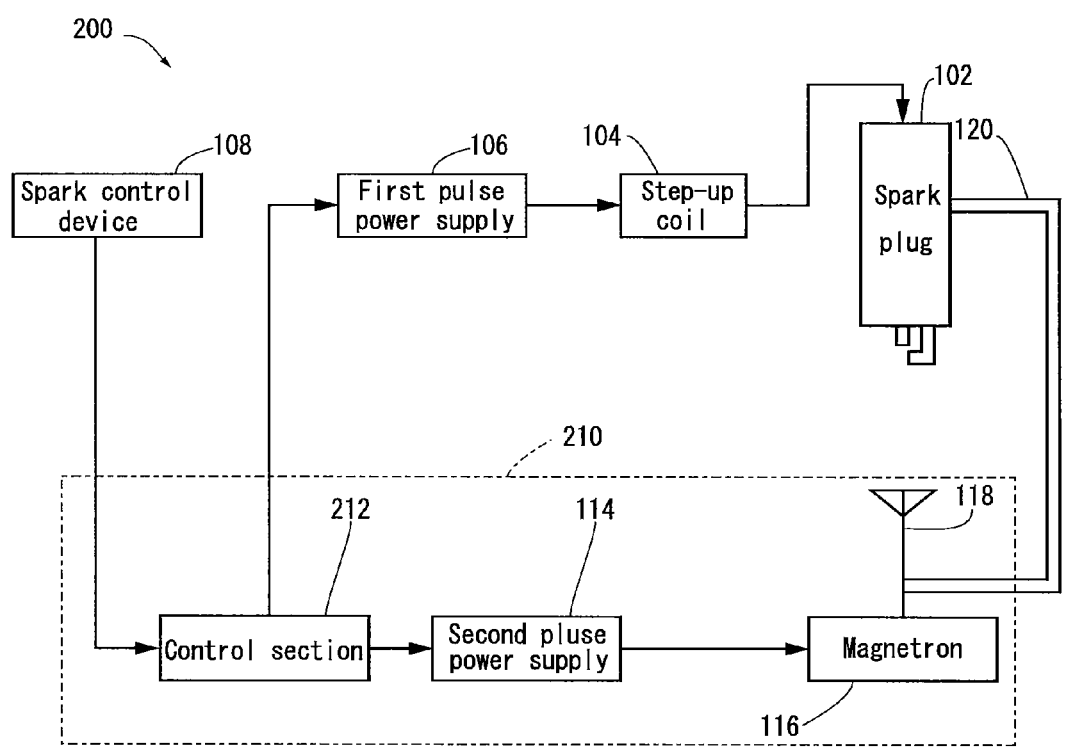
FIG. 5 is a block diagram showing an aspect of the plasma formation region control apparatus according to the first modification of the first embodiment.

An inverter-type power source may be used instead of the second pulse power supply shown in FIG. 1 or 5. Using an inverter-type power source makes it possible to generate and radiate a microwave pulse repeatedly.

The expanded plasma is cooled by surrounding gas while the energy input from the microwave pulse is interrupted. For example, setting the period of repetition to about one millisecond makes it possible to cool the plasma to an extent that the plasma in a region in which it is induced by expansion is not maintained. The plasma, gas, and surrounding matter can thereby be prevented from overheating even in an instance where the plasma is used under a high pressure and over a long period of time. Also, the plasma enters a non-equilibrium state each time the plasma re-expands; therefore, with respect to a macro timescale, the period of time over which the plasma is in a non-equilibrium state increases as the frequency of plasma re-expansion increases.

The period of repetition may be shorter than the time period between time t3 and time t5 in FIG. 2. A plasma can be re-expanded from a plasma that has been generated as a result of energy input from a preceding microwave pulse. By setting the period of repetition as described above, the plasma can be maintained and expanded even when the spark plug is no longer producing a discharge. For example, in an instance where an air plasma is being expanded under atmospheric pressure, setting the period of repetition so that the time between completion of one microwave pulse radiation and start of a next microwave radiation is about 80 microseconds or less makes it possible to maintain the plasma even when the spark plug is no longer producing a discharge.

If a period of repetition that is equal to the period of current alternation in an AC power source is acceptable, a combination of a regular AC power source and a half-wave rectifier can be used instead of the inverter-type power source to periodically feed power to the magnetron.

Third Modification of the First Embodiment

A semiconductor oscillator, widely used in fields such as telecommunication, can be used in place of the magnetron shown in FIG. 1 or 5, if the output power is sufficiently high. A semiconductor oscillator is generally more responsive than a magnetron, and therefore makes it possible to perform microwave pulse oscillation according to each of the methods described in FIGS. 2, 3, and 4 with a more accurate timing. In addition, it is generally easier to reduce the size of a semiconductor oscillator than that of a magnetron. This is conducive to reducing the size of a system according to the present invention.

Fourth Modification of the First Embodiment

The magnetron 116 does not necessarily require a direct connection to the spark plug 102. The microwave may be transmitted using a regular transmission channel such as a coaxial cable or a waveguide. An isolator may also be provided on the transmission channel in order to prevent a reflection of the microwave pulse from travelling in a reverse direction from the antenna. A stub tuner or a similar component may also be provided on the transmission channel in order to regulate impedance.

Fifth Modification of the First Embodiment

An antenna 118 of any position or shape may be used as long as it is capable of radiating microwaves so as to increase the electrical field strength in the location of pre-expansion plasma formation and therearound.

For example, the antenna 118 may be a monopole antenna in which a radiating end is positioned at a distance from the spark plug 102 reaching approximately 10 mm. Also, even when, for example, the discharge gap of the spark plug 102 and a feed point of the antenna 118 are separated by some distance, a directional antenna such as a parabolic antenna is capable of radiating microwaves so as to increase the electrical field strength in a region surrounding the discharge gap. Also, a desired electrical field strength can also be obtained by, for example, providing an earthed vane or microwave resonator in the vicinity of the discharge gap.

Sixth Modification of the First Embodiment

The plasma expansion device 100 or the plasma expansion device 200 may also have an electrically conductive container for covering both a section of the discharge gap of the spark plug 102 and the radiating end of the antenna 118. The container makes it possible to prevent microwaves from leaking.

The electrically conductive container may be provided so as to form a microwave resonance cavity. The microwaves radiated from the antenna can be emitted in a standing-wave configuration, and it is possible to designate the position of the plasma that results from expansion. In such an instance, the discharge gap of the spark plug 102 is preferably positioned in a vicinity of an anti-node of a standing wave.

Seventh Modification of the First Embodiment

In each of the embodiments described above, the plasma expansion device 110 or 210 is used for expanding a discharge plasma generated using a spark plug 102. However, these embodiments are not provided by way of limitation to the invention. A plasma may be generated by a pair of electrodes that does not constitute a spark plug. Such an electrode may be one that is coated with a dielectric body.

A plasma to be expanded in size by the plasma expansion device 110 or 210 may be one that is formed by a process other than an electrical discharge. For example, the plasma expansion device 110 or 210 may be used on a flame that is a weakly ionized plasma to expand the plasma to a region surrounding the flame. The flame itself may also be expanded. A plasma generated by a known plasma generator such as a plasma torch may also be used. A plasma generated by collisional ionization as a result of a collision between a particle beam and matter may also be used. A plasma generated by a collision or friction between solid bodies, such as a plasma generated using flint, may also be used. In any instance, the antenna must be positioned so that microwaves radiate towards the pre-expansion plasma and surroundings thereof.

Second Embodiment

Movement of the Plasma

In the first embodiment described above, a microwave pulse is radiated using an antenna to expand the size of a plasma. However, radiation of a microwave pulse using an antenna can be used not only to expand the size of the plasma but also to control the position of the plasma.

Figure 6:
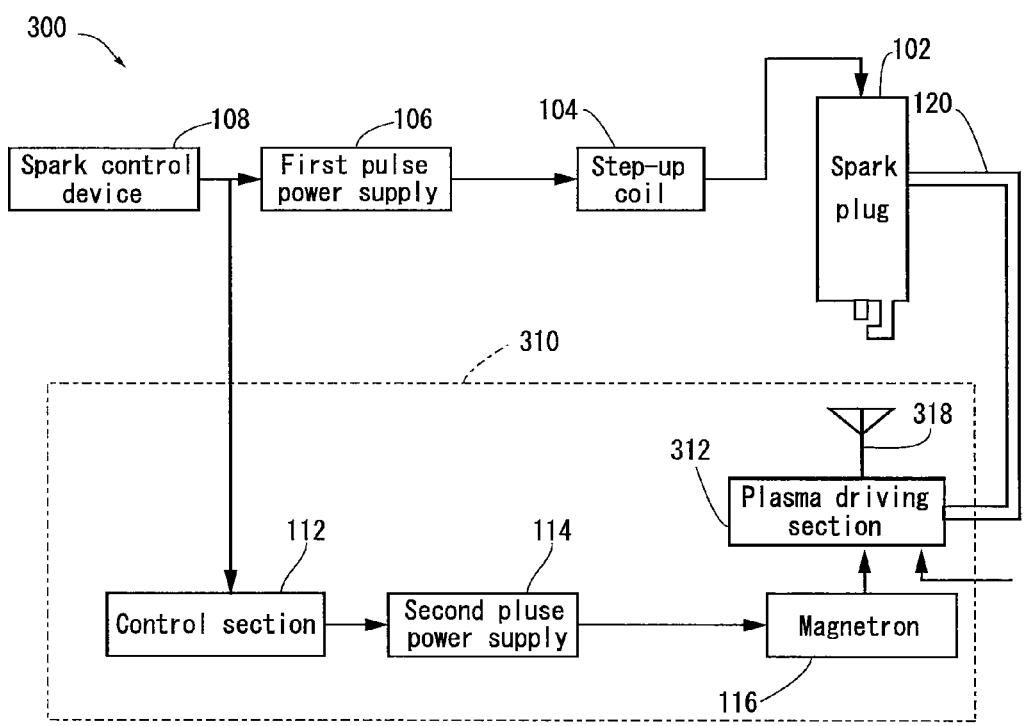
FIG. 6 is a block diagram showing an aspect of a plasma formation region control apparatus according to a second embodiment.

FIG. 6 is a block diagram showing an overall configuration of a system according to a second embodiment of the present invention.

As shown in FIG. 6, a plasma expansion device 300 comprises a spark plug 102, a step-up coil 104, a first pulse power supply 106, a spark control device 108, and a support member 120, each of which is identical to that in the first embodiment; as well as a plasma expansion device 310 used in place of the plasma expansion device 110 in the first embodiment. The plasma expansion device 310 not only expands a plasma generated by the spark plug 102 but also controls the position of the plasma.

The plasma expansion device 310 comprises a control section 112, a second pulse power supply 114, and a magnetron 116, each of which being identical to that in the first embodiment, as well as a plasma driving section 312 attached to the support member 120 and connected to the magnetron 116, and an antenna 318 connected to the plasma driving section 312. The plasma driving section 312 has a function for feeding power to the antenna 318, as well as adjusting the position and orientation of the antenna 318 so that a plasma is formed at a position that complies with an extraneous instruction received in relation to the position of the plasma.

Figure 7:
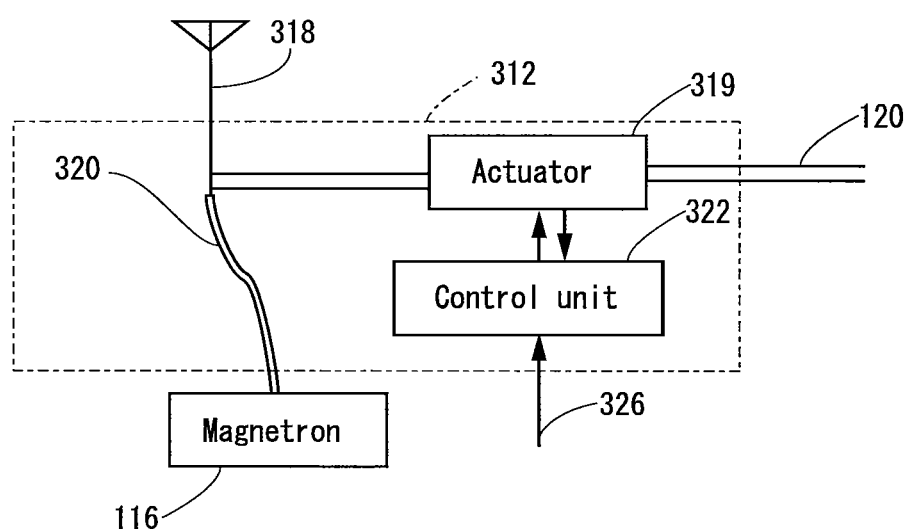
FIG. 7 is a schematic view showing a configuration of a plasma driving section.

FIG. 7 is a schematic view showing a configuration of the plasma driving section 312.

As shown in FIG. 7, the plasma driving section 312 comprises a flexible microwave transmission cable 320, one end of which being connected to the magnetron 116 and the other end connected to the antenna 318; an actuator 319, an arm of which being connected to the antenna 318 and a main body joined to the support member 120; and a control unit 322 connected to the actuator 319.

The actuator 319 has a function for adjusting the placement of the antenna 318 and supporting it in position so that the position and angle are in accordance with a received instruction signal, and for outputting information relating to the position and angle. In practice, the actuator 319 may be one that adjusts the placement of the antenna 318 in multiple degrees of freedom. The number of degrees of freedom, the scope of possible antenna movement, and the scope of possible rotation angles may be selected as appropriate according to, for example, the purpose for using the plasma.

The control unit 322 receives a signal indicating the present state of the actuator 319. The control unit 322 also receives an instruction signal 326 relating to the position of the plasma. The control unit 322 has a function for creating an instruction signal and outputting it to the actuator 319, the instruction signal showing the direction of movement, direction of orientation, speed of movement, and angular speed of the actuator 319.

FIG. 8 is a schematic drawing showing the operation of the present embodiment.

The operation in which the plasma expansion device 300 according to the present embodiment generates and expands a plasma is similar to the operation of the system according to the first embodiment. The operation is assumed to generate a plasma directly above the antenna 318 as shown in FIG. 8(a). When the control unit 322 then receives an instruction signal instructing the control unit to move the plasma rightwards in the drawing, the control unit 322 issues an instruction signal to the actuator 319 instructing the antenna 318 to be moved rightwards. The speed of movement of the antenna in this instance is a predetermined speed that is less than, for example, the speed of microwave-induced plasma expansion according to the first embodiment.

When the antenna 318 moves rightwards from a position shown in FIG. 8(a), a region with high electrical field strength is generated rightward of a plasma 325, aiding expansion of the plasma. Meanwhile, the electrical field strength leftward of the plasma decreases, inhibiting and eventually reversing expansion of the plasma. The plasma 325 expands to the right and shrinks to the left, and as a result, the plasma 325 moves rightwards as shown in FIG. 8(b).

When the antenna 318 is caused to tilt while continuing to move rightwards, the plasma moves to correspond with the electrical field strength distribution created by radiation by the antenna 318, so that the configuration shown in FIG. 8(c) is obtained.

Changing the placement of the antenna 318 as described above makes it possible to reposition the plasma to a desired position. The plasma is repositioned so as to follow the movement and tilting of the antenna 318. The electrical field strength distribution can be very readily changed by repositioning the antenna, and the process is easier to understand than a process of moving the plasma using multiple control of magnetic and electrical fields. Therefore, the plasma can be placed in a desired position with ease.

By moving and scanning a plasma at a high speed through a given region, it becomes possible to intermittently apply the plasma to matter present in, or passing through, the region. Such a procedure has an effect equivalent to that of a periodic plasma treatment, as long as the time difference in plasma action within the region is not taken into account.

Also, after the plasma is moved and scanned at a high speed through a given region, a section through which the plasma has passed will cool until a plasma passes through the section again. As a result, it is possible to reduce the incidence of overheating or excessive reaction caused by the plasma. A configuration in which the plasma passes through the region before the plasma reaches thermal equilibrium makes it possible to obtain a non-equilibrium plasma even if the microwaves are emitted continuously.

By adjusting the speed of the plasma operation, it is possible to configure a working piece treatment process using a plasma that has a constant frequency and pattern, in an instance where a fixed chemical reaction is involved. In other words, by configuring a movement and scan path in advance, and causing the plasma to follow the path at regular intervals, it becomes possible to create a space through which the plasma periodically passes. By controlling the speed of movement, it becomes possible to change the amount of time for which the plasma acts on each section within the region. The intensity of the plasma action can thus be spatially distributed within the region.

The method for moving the region with high electrical field strength is not limited to one that uses an actuator. The region with high electrical field strength may be moved by attaching the antenna to an object that moves in a periodic manner, or to an object that rotates. Also, the method is not limited to one in which the antenna is mechanically moved. The region with high electrical field strength may be moved using a selection of, or a combination of, a plurality of antennas, using a method such as a spatial diversity method or a phased array method. In particular, the phased array method makes it possible to move the region with high electrical field strength at a high speed.

The antenna may be extended, contracted, expanded, folded or otherwise manipulated to change its shape, thereby moving the region with high electrical field strength and changing the spatial distribution.

<Measurement of Plasma Formation Region Specifications>

Each of the embodiments described above shows an example in which the position of the antenna or the driving sequence is established according to the state of radicals, ions, or a gas, or the electron density, within the plasma. However, the position of the antenna or the driving sequence may be established according to another state function of the specified plasma, the intensity of plasma emission, the intensity of an emission element within a predetermined wavelength range, electron temperature, electron travel velocity, or electron path.

The state function of the specified plasma may be, for example, composition of the plasma, or the density of ions, radicals, gas and the like. Measurement of such state functions may be performed using a detector that uses a photomultiplier tube, a microchannel plate detector, or a similar device to increase the quantity of, and detect, electrons transported from an excited test sample; a detector that uses a Faraday cup or a similar device to perform measurements of the excited test sample, or a detection device comprising a cloud chamber and an imaging device. A separation and analysis device, such as those of a magnetic field-deflection type, a quadrupole type, an ion-trap type, a time-of-flight type, a Fourier-transform ion cyclotron resonance type, or a tandem type may be provided to a step preceding a detector of such description.

The intensity of plasma emission or the intensity of an emission element within a predetermined wavelength range may be detected by extracting light originating from the plasma formation region using an optical window, an opening, an optical fiber, a lens, a mirror, or a similar device and measuring the extracted light using an image sensor or an optical sensor that uses a device such as a photomultiplier tube, a complementary metal-oxide semiconductor device, or a charge-coupled device.

The electron temperature, travel velocity, and path may be measured using a measurement method described above or using one of a wide variety of well-known types of electron detectors.

The results of the measurement described above do not have to be used to establish the position of the antenna or the driving sequence. Such results, or the results obtained by measuring the states of the radicals, the ions, or the gas, or the electron density may also be used to regulate, for example, matter being supplied to the plasma formation region. They may be used to regulate the supply quantity or supply speed, or cause a phase change or a phase transition in the matter. The temperature or another attribute of the matter may also be regulated. In an instance where the supplied matter is a fluid, the pressure of the fluid may also be regulated.

<Dividing and Combining Plasma Formation Regions>

In an instance where a plurality of plasma formation regions are present in time or space, positioning the antenna and establishing a driving sequence so that a region with high electrical field strength is formed between each of the plasma formation regions makes it possible for each of the plasma formation regions on either side of the region with high electrical field strength to be moved towards each other. It also becomes possible to combine a plurality of plasma formation regions by repeating the control described above.

Positioning the antenna and establishing the driving sequence so that a plurality of regions with a high electrical field strength are created within one plasma formation region makes it possible to form a plasma formation region with a plurality of regions having a high energy density. A configuration wherein the distance between each of the regions with a high electrical field strength increases with time makes it possible to divide the plasma formation region and create a plurality of plasma formation regions.

In the embodiments described above, a plasma is generated from a gas. However, solid-phase or liquid-phase matter may be present in the plasma formation region or a region in which the plasma formation region control apparatus is expected to generate a plasma. A mixture of solid-phase, liquid-phase, and gaseous-phase matter may also be present.

Although a specific form of embodiment of the instant invention has been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention which is to be determined by the following claims.

The invention claimed is:

1. A plasma formation region control apparatus for controlling a region of plasma formation under a pressure equal to or exceeding atmospheric pressure, the plasma formation region control apparatus comprising:
   one or a plurality of electromagnetic wave oscillators;
   one or a plurality of antennas connected to the electromagnetic wave oscillator; and
   controller controlling the electromagnetic wave oscillator and the antenna; wherein
   the controller positions the antenna in accordance with a spatial distribution of an electrical field that corresponds to a plasma formation region, the spatial distribution being based on a specification for the plasma region for respective points in time; establishes a sequence for driving the electromagnetic wave oscillator based on the state of radicals, ions, or a gas, or the electron density, within the specified plasma; and drives the electromagnetic wave oscillator according to the sequence.

2. A plasma formation region control apparatus for controlling a region of plasma formation under a pressure equal to or exceeding atmospheric pressure, the plasma formation region control apparatus comprising:
   one or a plurality of electromagnetic wave oscillators;
   one or a plurality of antennas connected to the electromagnetic wave oscillator; and
   controller controlling the electromagnetic wave oscillator and the antenna; wherein
   the controller positions the antenna in accordance with a spatial distribution of an electrical field that corresponds to a plasma formation region, the spatial distribution being based on a specification for the plasma region for respective points in time; establishes a sequence for driving the electromagnetic wave oscillator based on a state function of the specified plasma, the intensity of plasma emission, or the intensity of an emission element within a predetermined wavelength range, or of the electron temperature, travel velocity, or path; and drives the electromagnetic wave oscillator according to the sequence.

3. The plasma formation region control apparatus according to claim 1, wherein
   the controller establishes the sequence so that electromagnetic waves are emitted by the electromagnetic wave oscillator and the antenna for a time period that is shorter than the thermal relaxation time of electrons and radicals, ions, or gas generated in the plasma formation region.

4. The plasma formation region control apparatus according to claim 1, wherein
   the controller establishes the sequence so that electromagnetic waves are emitted by the electromagnetic wave oscillator and the antenna for a time period until radicals, ions, or gas generated in the plasma formation region reach a predetermined temperature.

5. The plasma formation region control apparatus according to claim 1, wherein
   the controller establishes the sequence so that emission of electromagnetic waves ceases when a time period that is shorter than thermal relaxation time of electrons and radicals, ions, or gas generated in the plasma formation region elapses from the scheduled time of plasma generation.

6. The plasma formation region control apparatus according to claim 1, wherein
   the controller repeatedly drives the electromagnetic wave oscillator in accordance with the sequence.

7. The plasma formation region control apparatus according to claim 1, wherein
   the controller establishes the plasma formation region so as to enclose a point within a region in which the plasma is due to be generated, and drives the electromagnetic wave oscillator from a point in time that precedes the scheduled time of plasma generation by a predetermined time period.

8. The plasma formation region control apparatus according to claim 1, wherein
   the controller continuously drives the electromagnetic wave oscillator in accordance with the sequence.

9. The plasma formation region control apparatus according to claim 1, wherein
   a location at which an electrical field created by electromagnetic waves radiating from the antenna is at maximum intensity at a predetermined point in time is positioned outside a region in which plasma is present at the point in time, and the maximum intensity is less than an electrical field strength at which a substance within the plasma formation region at the point in time undergoes electrical breakdown.

10. The plasma formation region control apparatus according to claim 1, wherein
    the controller has means for holding the antenna in a moveable and/or rotatable manner, wherein the means for holding the antenna points the antenna towards the plasma formation region at respective points in time.

11. The plasma formation region control apparatus according to claim 1, wherein
the controller further has means for configuring the antenna shape in accordance with the spatial distribution of the corresponding electrical field.

12. The plasma formation region control apparatus according to claim 1, wherein
a plurality of the plasma formation region exists in time or space, and the antenna is positioned and the sequence established so that the electrical field distribution is formed in a region between each of the plasma formation regions.

13. The plasma formation region control apparatus according to claim 1, wherein
the antenna is positioned and a sequence established so as to cause a plurality of locations with an extremely high electrical field strength to form within the plasma formation region at a predetermined point in time.

14. The plasma formation region control apparatus according to claim 13, wherein
a distance between each of the locations with an extremely high electrical field strength increases after the predetermined point in time.

15. A plasma processing apparatus, comprising:
a formation region control apparatus according to claim 1, wherein the plasma controlled by the plasma formation region control apparatus is used to process a substance that is present within the plasma formation region.

16. The plasma processing apparatus according to claim 15, further comprising:
an extracting portion extracting light originating from the plasma formation region.

17. The plasma processing apparatus according to claim 15, further comprising:
a detector taking measurements of a plasma that forms in the plasma formation region, wherein supply of the substance is regulated according to a result of a measurement taken by the detector.

18. The plasma processing apparatus according to claim 15, further comprising:
a detector taking measurements of a plasma that forms in the plasma formation region, wherein the controller performs at least one of positioning the antenna and establishing the sequence in accordance with a result of measurement taken by the detector.

19. The plasma formation region control apparatus according to claim 2, wherein
the controller establishes the sequence so that electromagnetic waves are emitted by the electromagnetic wave oscillator and the antenna for a time period that is shorter than the thermal relaxation time of electrons and radicals, ions, or gas generated in the plasma formation region.

20. A plasma processing apparatus, comprising:
a formation region control apparatus according to claim 2, wherein
the controller establishes the sequence so that emission of electromagnetic waves ceases when a time period that is shorter than thermal relaxation time of electrons and radicals, ions, or gas generated in the plasma formation region elapses from the scheduled time of plasma generation.

* * * * *